United States Patent
Aton et al.

(10) Patent No.: US 7,765,516 B2
(45) Date of Patent: Jul. 27, 2010

(54) SYSTEM AND METHOD FOR MAKING PHOTOMASKS

(75) Inventors: Thomas J. Aton, Dallas, TX (US); Carl A. Vickery, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 173 days.

(21) Appl. No.: 11/940,194

(22) Filed: Nov. 14, 2007

(65) Prior Publication Data

US 2009/0125864 A1     May 14, 2009

(51) Int. Cl.
*G06F 17/50* (2006.01)
(52) U.S. Cl. ........................................... 716/19; 716/21
(58) Field of Classification Search ................... 716/19, 716/21
See application file for complete search history.

(56) References Cited

U.S. PATENT DOCUMENTS

| | | | | |
|---|---|---|---|---|
| 6,081,658 | A * | 6/2000 | Rieger et al. | 716/21 |
| 6,269,472 | B1 * | 7/2001 | Garza et al. | 716/21 |
| 6,298,473 | B1 * | 10/2001 | Ono et al. | 716/21 |
| 6,764,795 | B2 | 7/2004 | Aton et al. | |
| 2004/0205688 | A1 * | 10/2004 | Pierrat | 716/21 |
| 2006/0129968 | A1 * | 6/2006 | Pierrat | 716/21 |

OTHER PUBLICATIONS

Aton, U.S. Appl. No. 11/771,515, filed Jun. 29, 2007.
Aton, U.S. Appl. No. 11/940,990, filed Nov. 15, 2007.
Aton et al.. U.S. Appl. No. 11/940,016, filed Nov. 14, 2007.
Aton, U.S. Appl. No. 11/863,753, filed Sep. 28, 2007.
Aton et al., U.S. Appl. No. 11/940,270, filed Nov. 14, 2007.
Aton, U.S. Appl. No. 11/863,717, filed Sep. 28, 2007.
Aton et al., U.S. Appl. No. 11/940,245, filed Nov. 14, 2007.

* cited by examiner

*Primary Examiner*—Stacy A Whitmore
*Assistant Examiner*—Magid Y Dimyan
(74) *Attorney, Agent, or Firm*—Warren L. Franz; Wade J. Brady, III; Frederick J. Telecky, Jr.

(57) ABSTRACT

The present application is directed a method for preparing a mask pattern database for proximity correction. The method comprises receiving data from a design database. Mask pattern data describing a first photomask pattern for forming first device features is generated. The first photomask pattern is to be corrected for proximity effects in a proximity correction process. A second set of data is accessed comprising information about second device features, wherein at least a portion of the second set of data is relevant to the proximity correction process. The second set of data is manipulated so as to improve the proximity correction process, as compared with the same proximity correction process in which the second set of data was included in the mask pattern database without being manipulated. At least a portion of the mask pattern data and at least a portion of the manipulated second set of data is included in the mask pattern database.

13 Claims, 3 Drawing Sheets

SYSTEM AND METHOD FOR MAKING PHOTOMASKS

DESCRIPTION OF THE DISCLOSURE

1. Field of the Disclosure

The present application relates generally to the field of photolithography, and more specifically to a method and system for preparing a pattern for a photomask.

2. Background of the Disclosure

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a photomask, or "reticle", includes a semiconductor circuit layout pattern typically formed of opaque chrome, on a transparent glass (typically $SiO_2$) substrate. A stepper includes a light source and optics that project light coming through the photomask to image the circuit pattern, typically with a 4× to 5× reduction factor, on a photo-resist film formed on a wafer. The term "chrome" refers to an opaque masking material that is typically but not always comprised of chrome. The transmission of the opaque material may also vary such as in the case of an attenuating phase shift mask.

As the critical dimensions of integrated circuits continue to decrease, there is a need to pattern smaller and smaller features. Modern photolithographic systems often employ light in the imaging process which has a larger wavelength than the critical dimensions of the device features being formed on the integrated circuits. When critical dimensions are printed at less than or equal to the wavelength of light being used, the wave properties of the light become a dominant property of the lithography. In general, these wave properties are seen as being a limiting factor in lithography. There are, however, techniques for extending optical lithography beyond the range of conventional imaging.

One such technique is known as optical proximity correction. After the initial photomask patterns are formed, optical proximity correction is carried out to correct the mask pattern data for proximity effects. The proximity correction process generally involves running proximity correction software to perform calculations that alter the shape of the initial photomask pattern to take into account proximity effects, such as optical diffraction effects that occur during the imaging process. In this method, computer simulation software is often used to compute image-like model values that are taken to represent the features formed for a particular photomask feature pattern or group of patterns. Based on these simulated model values, the photomask pattern can be altered and then simulated again to determine if the altered pattern will improve the printed features. This process can be repeated until the result is within desired specifications. The features added to a photomask pattern based on this procedure are called optical proximity correction features.

The computer simulation software, also referred to herein as proximity correction software, simulates the desired corrections based on a mask pattern data set that is provided by a user. The mask pattern data set provides the desired data, including drawn device pattern data, initial mask pattern data, and other data prepared by the user. The proximity correction software is often required to sort through the mask pattern data set to locate objects and generate parameters that are relevant to perform the desired proximity correction calculations.

As the density of circuit devices continues to increase, the amount of data that must be managed by the optical proximity correction software has become increasingly large. Managing such large amounts of information can slow the proximity correction process, increase the likelihood of errors, and increase process costs.

In the past, markers have been attached to data for communicating information to the proximity correction software in order to aid in the handling of data during the proximity correction process. However, additional methods for streamlining the handling of data and/or reducing the amount of data that must be managed in the proximity correction process would be desirable improvements in the mask manufacturing process.

SUMMARY OF THE DISCLOSURE

In accordance with the disclosure, an embodiment of the present teachings is directed a method for preparing a mask pattern database for proximity correction. The method comprises receiving data from a design database, Mask pattern data describing a first photomask pattern for forming first device features is generated. The first photomask pattern is to be corrected for proximity effects in a proximity correction process. A second set of data is accessed comprising information about second device features, wherein at least a portion of the second set of data is relevant to the proximity correction process. The second set of data is manipulated so as to improve the proximity correction process, as compared with the same proximity correction process in which the second set of data was included in the mask pattern database without being manipulated. At least a portion of the mask pattern data and at least a portion of the manipulated second set of data is included in the mask pattern database.

Another embodiment of the present disclosure is directed to a method for preparing a mask pattern database for proximity correction. The method comprises generating mask pattern data describing a photomask pattern for forming an electrically conductive layer, wherein the photomask pattern is to be corrected for proximity effects in a proximity correction process. A second set of data is accessed comprising information about a biasing layer that is to be formed adjacent to the conductive layer. The second pattern data is sorted into a first data subset and a second data subset. The first data subset includes the second pattern data that is relevant to retargeting the mask pattern during the proximity correction process. The second data subset includes the second pattern data that is not relevant to retargeting the mask pattern during the proximity correction process. The first data subset is included in the mask pattern database and the second data subset is excluded from the mask pattern database.

Additional objects and embodiments of the disclosure will be set forth in part in the description which follows, and can be learned by practice of the disclosure. It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

Figure 1:
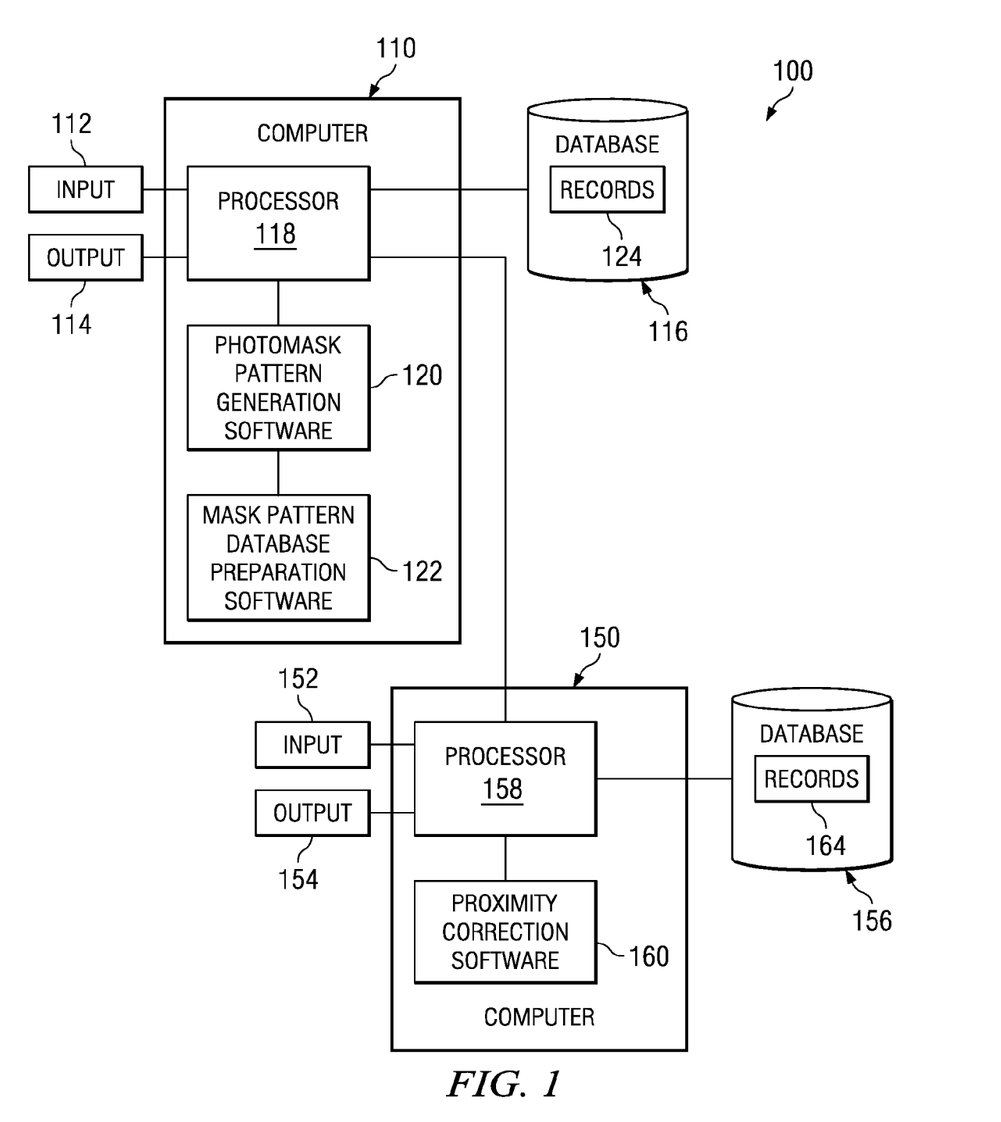
FIG. 1 illustrates a system for forming a photomask pattern, according to an embodiment of the present disclosure.

FIG. 1 illustrates a system 100 for forming a photomask pattern, according to an embodiment of the present disclosure. System 100 includes a first computer 110 and a second computer 150. Input devices 112, 152 and output devices 114, 154 are respectively coupled to computers 110 and 150, which are in turn respectively coupled to databases 116, 156, as shown in FIG. 1. Input devices 112, 152 may comprise, for example, a keyboard, a mouse, a network, and/or any other system or device suitable for inputting and manipulating data to the respective computers 110 and 150. Output devices 114, 154 may comprise, for example, a display, a printer, and/or any other device suitable for presenting data from the respective computers 110 and 150.

Computers 110 and 150 can be personal computers, workstations, networked computers, or any other suitable processing platform. Computers 110 and 150 may include processors 118, 158, as shown in FIG. 1. The processor 118, 158 can be implemented using at least one microprocessor from vendors such as Intel, Advanced Micro Devices, Transmeta, IBM, or other circuit manufacturers. In addition, computer 110 can include photomask pattern generation software 120 and mask pattern database preparation software 122. Computer 150 can include proximity correction software 160.

Photomask pattern generation software 120, mask pattern database preparation software 122, and proximity correction software 160 can exist as software that comprises computer readable program instructions in source code, object code, executable code or other formats; program instructions implemented in firmware; or hardware description language (HDL) files. Any of the above can be embodied on a computer readable medium, which include storage devices, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 118 can be configured to control the flow of data between input device 112, output device 114, database 116, photomask pattern generation software 120 and mask pattern database preparation software 122. Photomask pattern generation software 120 may receive descriptions of integrated circuit device features from database 116 and generate photomask patterns. Mask pattern database preparation software 122 can prepare a mask pattern database, which can include mask pattern data generated by photomask pattern generation software 120. While an embodiment of FIG. 1 illustrates the photomask pattern generation software 120 and the mask pattern database preparation software 122 separately, the photomask pattern generation and mask pattern database preparation can be carried out using any suitable computer program design employing one or more computers. For example, the photomask pattern generation and mask pattern database preparation can both be performed using a single set of code on a single computer, or by separate sets of code located on different computers. One of ordinary skill in the art would readily be able to program computer readable code to implement the disclosed processes given the teachings of the present disclosure. Once the mask pattern database is prepared, processor 118 can transfer the mask pattern database to computer 150 for further processing. The computers 110, 150 can be coupled together over a network (not shown). The network can be a local area network, a wide area network or a combination thereof. The communication protocol between the computers 110, 150 can be implemented with IEEE802.x, token ring, or any other network protocol.

Processor 158 of computer 150 can be configured to control the flow of data between input device 152, output device 154, database 156, and proximity correction software 160. Proximity correction software 160 can be configured to process the mask pattern data received from computer 150. Specifically, proximity correction software 160 performs a proximity correction process that corrects the mask pattern data for proximity effects.

Databases 116, 156 may comprise any suitable system for storing data. Databases 116, 156 can be implemented using mask database technologies employing file formats such as GDSII or Oasis or any other similar database formats. Database 116 can store records 124 (data or files) that comprise data associated with the integrated circuit device features and the photomask patterns to be generated, such as data from a design database and mask pattern database, as will be described in greater detail below. Database 156 may store records 164 (data or files) that comprise data associated with the proximity correction process, such as, for example, the mask pattern database transferred from computer 110.

Figure 2:
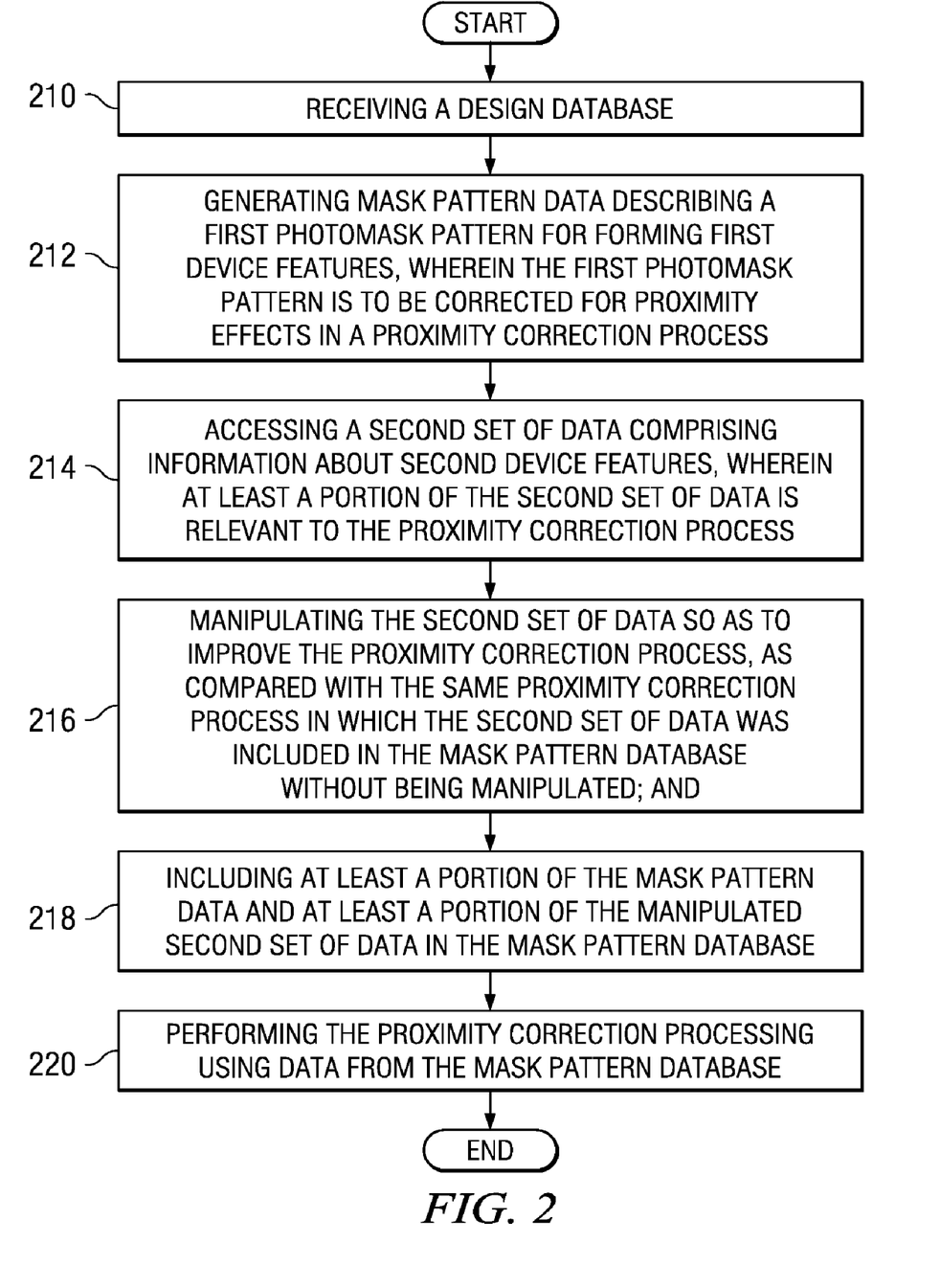
FIG. 2 illustrates a flow diagram of a process for making photomasks, according to an embodiment of the present disclosure.

FIG. 2 illustrates a flow diagram 200 of one embodiment of a process for making photomasks according to the present disclosure. It should be readily apparent to those of ordinary skill in the art that the flow diagram 200 depicted in FIG. 2 represents a generalized schematic illustration and that other steps may be added or existing steps may be removed or modified.

As shown in FIG. 2, the process generally includes preparing a mask pattern database, as described in blocks 210 to 218; and further processing of the mask pattern data in a proximity correction process, as described in block 220. In one embodiment, the process of preparing the mask pattern database described in blocks 210 to 218 can be performed on a single computer, such as computer 110 of FIG. 1. The mask pattern database can then be transferred to a second computer, such as computer 150 of FIG. 1, to perform the proximity correction processing. In other embodiments, at least some of the process for preparing the mask pattern database can be carried out on the same computer used to perform the proximity correction processing, such as, for example, any of the steps described in blocks 214 to 218. In yet other embodiments, the process depicted in FIG. 2, including the proximity correction process, can be performed on a single computer.

The process of FIG. 2 may be employed for making any type of photomasks, including phase shift masks and trim masks for use in a phase shift process (altPSM), binary masks, embedded attenuated phase shift masks, hard phase shift masks, double-dipole exposure masks, or any other suitable type of mask. The embodiments of the present application are not intended to be limited to the processes illustrated in FIG.

2, and other additional processes, such as data verification procedures, which are not shown in the flow diagram of FIG. 2, may also be employed.

As shown in block 210 of FIG. 2, the process begins by receiving data from a design database. The design database contains data describing at least a portion of an integrated circuit design layout, referred to as the "drawn" pattern. Techniques for forming design databases are well known in the art.

After the design database is received, mask makers use the design data to make one or more photomasks that can be used to implement the integrated circuit design described in the design database. As indicated in block 212 of FIG. 2, this mask making process may generally include generating mask pattern data describing initial photomask patterns for forming device features, such as gate structures or metallization structures. The generation of the mask pattern data can be done by the photomask pattern generation software 120, which outputs an initial photomask patterns. The initial photomask patterns are corrected for proximity effects in a subsequent proximity correction process carried out in block 220, as will be described below.

The initial photomask patterns are formed by employing various resolution enhancement techniques, which can be programmed into the photomask pattern generation software 120 and executed by the processor 118. In some embodiments, the resolution enhancement techniques may include redrawing portions of the drawn pattern. For example, in some instances it may be determined that the drawn pattern may be difficult or impossible to pattern given the constraints of the lithography system being employed. In such instances, it may be desirable to redraw the design data pattern to account for these lithography restraints, while achieving the basic circuit functionality intended by the drawn pattern.

The resolution enhancement techniques can also include splitting the drawn pattern so that it is patterned using two or more photomasks. Any suitable types of photomasks can be employed, including two attenuated embedded phase shift masks. Other non-limiting examples of suitable masks include a phase shift mask and a trim mask, for use in an alternating phase shift process (altPSM), as mentioned above. Methods for forming such masks from design data are well known in the art, and any suitable method for forming such masks may be employed. In an embodiment, phase and trim patterns are generated using software programs designed to read data from the design database and prepare appropriate patterns for forming the masks used to make the integrated circuit designs described in the database. One example of a suitable software program is IN-PHASE, which is available from SYNOPSYS, Inc., having corporate headquarters located in Mountain View, Calif.

Yet another example of resolution enhancement techniques for forming the initial photomask patterns may include the formation of sub-resolution assist features (SRAFs). Techniques for forming SRAFs are well known in the art.

The shape of the initial photomask pattern may generally reflect a mask target pattern, which is the desired shape of the final pattern to be formed on the wafer. The mask target pattern may be somewhat different than the target pattern described in the design database do to alterations made by the mask makers to account for such things as limitations of the lithography system, as described above. Further, the initial photomask pattern can also include other pattern features not intended to be formed on the wafer, such as SRAF.

The initial photomask pattern data can be included in the mask pattern database, which database is prepared by the mask pattern database preparation software 122. As indicated in block 214, preparing the mask pattern database can also include accessing a second set of other data, in addition to the mask pattern data. In some embodiments of the present disclosure, this second set of data can comprise information about second device features. At least a portion of the second set of data is relevant to the proximity correction process of block 220. For example, this second set of data can include data for describing biasing layers, such as the location of contacts that are to be formed adjacent to the first device feature, as will be described in greater detail below.

The term "contact" is sometimes referred to in the art of integrated circuits as being limited to electrical connecting structures between metal 1 and the device structures formed on the wafer (e.g., contacts made from metal 1 to gates or active regions). However, for purposes of this disclosure, the term "contact" is defined to include any electrical connection made between upper and lower levels of a device, including contacts formed between metal 1 and the device structures on the wafer, as well as metal to metal contacts formed between upper level metallization structures (often referred to as vias or via fill). The contacts can comprise any suitable electrical conducting material, such as doped polysilicon or metal.

As illustrated in block 216, the second set of data can be manipulated by the mask pattern database preparation software 122. Manipulation of the second set of data is designed to improve the proximity correction process, by for example, reducing the processing time of the proximity correction process as compared with the same proximity correction process in which the second set of data was included in the mask pattern database without being manipulated.

For example, this can include manipulating the second set of data into a first subset of data that includes the pattern data that has a first relevance to the proximity correction process; and a second subset of data that has a second relevance to the proximity correction process. Any suitable set of parameters may be used to determine the relevance of the second set of data to the proximity correction process. For example, the data may be considered relevant if it can be employed by the proximity correction software to perform calculations that will have some affect on the resulting photomask pattern. In one embodiment, the second set of data can be sorted into a first subset of data that is relevant to retargeting the initial photomask pattern during the proximity correction process; and a second subset that includes pattern data that is not relevant to retargeting the initial photomask pattern data during the proximity correction process.

By the phrase "retargeting the initial photomask pattern", it is meant that the proximity correction software can be programmed to, in effect, redraw the initial photomask patterns of the mask pattern database to adjust the mask target pattern to take into account the second set of data, and thereby achieve a desired objective. For example, where the objective is that an adjacent biasing layer make electrical contact with an electrically conductive layer pattern that is being corrected for proximity effects, the proximity correction software can be programmed to, under certain circumstances, redraw the mask pattern for the conductive layer. In one such embodiment, as will be discussed in greater detail below, if it is determined that the biasing layer will not sufficiently contact the conductive layer, the proximity correction software can redraw the conductive layer pattern in a way that provides for the desired electrical contact with the biasing layer.

In various embodiments, manipulating the data may include excluding data that is not considered relevant to the proximity correction process, or marking or otherwise categorizing the data based on the sorting process so that it can be more efficiently used by the proximity correction process, as will be discussed in greater detail below. As indicated in block 218 of FIG. 2, at least a portion of the manipulated second set of data is stored in the mask pattern database, along with at least a portion of the mask pattern data that is to be corrected for proximity effects. The proximity correction process can then be performed using the data from the mask pattern database, as indicated in block 220.

In order to more closely achieve the desired mask target pattern, the initial photomask pattern of block 212 is corrected for proximity effects in a proximity correction process. As discussed above, the proximity correction process generally involves implementing proximity correction software that performs calculations that alter the shape of the initial photomask pattern to take into account proximity effects, such as optical diffraction effects that occur during the imaging process. Any suitable technique for correcting for proximity effects may be employed. One example of a known proximity correction process is disclosed in U.S. Pat. No. 6,764,795, issued on Jul. 20, 2004 to Aton et al., the disclosure of which is herein incorporated by reference in its entirety.

In addition to adjusting for proximity effects, the proximity correction software can also be programmed to alter the initial photomask pattern to adjust the shape of the mask target pattern. Such alterations may be referred to as "retargeting" the initial photomask pattern, and described in greater detail above.

In some embodiments, correcting for proximity effects in block 220 of the process of FIG. 2 can involve the transfer of data from the computer that carries out the initial photomask pattern generating process of block 212, to a computer that will implement the proximity correction process. In one embodiment of the present application, a mask pattern database, as described above, is prepared to facilitate this transfer of data. The mask pattern database can include the mask pattern data describing the initial photomask pattern that is generated in block 212, as well as other data that may be relevant to the proximity correction process.

After correction of the initial photomask pattern for optical proximity effects in block 220, the mask pattern data can be put through a verification process to insure that it meets desired quality standards, and is otherwise prepared for manufacturing, or writing, of the photomask. For example, the mask pattern data may be fractured, which puts the data in a form which is compatible with the mask writing process. The data fracture process may be accomplished using any suitable software program. One example of a suitable software program known in the art for mask data fracturing is CATS, which is available from SYNOPSYS, Inc.

Once the preparation of the mask data is complete, the data can then be used to write the photomasks. Often the mask pattern data is sent to a mask shop, where actual production of the photomasks occurs. Any suitable technique for writing the photomask may be employed. Suitable techniques for writing masks are well known in the art.

Figure 3:
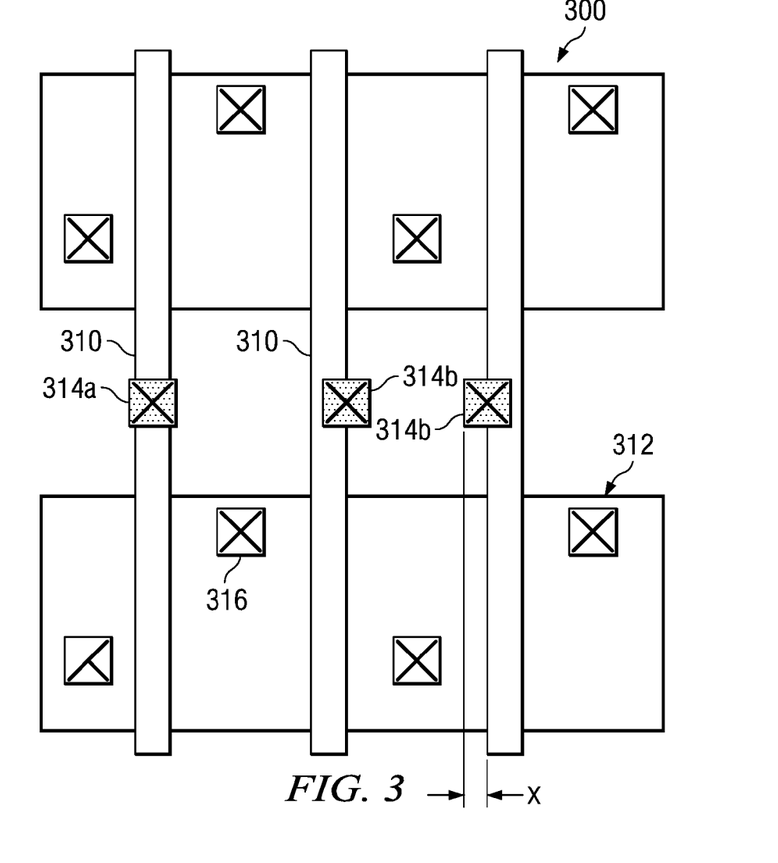
FIG. 3 illustrates a drawn circuit layout, according to an embodiment of the present disclosure.

FIG. 3 illustrates one example of a drawn circuit layout 300, according to an embodiment of the present application. The circuit layout includes device features that are conductive layer patterns, such as gate structure patterns 310 formed over active region patterns 312. The layout 300 also includes pattern information regarding second device features formed adjacent to gate structure patterns 310, such as contact locations 314a and 314b that are positioned on the gate structure. Layout 300 also includes contact locations 316 that are not positioned on the gate structure, but instead are positioned on active region patterns 312. As discussed above, data describing such circuit layout patterns can be stored in a design database.

The drawn circuit layout 300 can be used to generate a mask pattern database, as described above with reference to FIG. 2. For example, mask pattern data can be generated that describe initial photomask patterns, such as phase patterns and trim patterns (not illustrated), for forming the gate structure patterns 310, as is well known in the art. Mask patterns realized using either a single mask or mask pattern sets, which may include two or more separate masks, may be employed as is appropriate to different lithographic techniques.

As described above, in preparation for correcting the initial photomask patterns for proximity effects, a mask pattern database is prepared. The mask pattern database can include the mask pattern data describing the photomask patterns, including, for example, the phase pattern data and trim pattern data. In addition, preparing the mask pattern database also includes accessing a second set of data, which in this example, is data describing the contact locations 314a, 314b and 316.

The second set of data can be sorted to determine which data is relevant to the proximity correction process. In this case, contact locations 314a and 314b can be considered relevant, because this data can be used to retarget gate structure patterns 310 in the regions where the contacts are to be formed in order to insure appropriate electrical contact is made between gate structures 310 and the contacts 314a and 314b. This retargeting process, which can be particularly useful for forming contacts without a contact pad, is described in greater detail in copending U.S. patent application Ser. No. 11/940,270, entitled SYSTEM AND METHOD FOR MAKING PHOTOMASKS, filed Nov. 14, 2007, in the name of Thomas J. Aton et al., the disclosure of which is hereby incorporated by reference in its entirety.

In this embodiment, data regarding contact locations 316, which are not positioned on gate structures 110, are not considered relevant to the proximity correction process because they will not affect the shape of the gate structure patterns 310. Accordingly, it would be desirable to exclude data regarding contact locations 316 from the mask pattern database. Excluding the data can be accomplished by any suitable method. For example, the contact location data for contacts 314a, 314b and 316 can be sorted into a first data subset and a second data subset. The first subset can include the relevant contact locations 214a and 314b, and the second subset can include the contact locations 316 that are not relevant. The first data subset can then be included, and the second data subset excluded, from the mask pattern database.

In other embodiments, it may be that only some of the contacts 314 that are positioned on the gate structure 310 of FIG. 3 are considered relevant to the proximity correction process. For example, it may be determined that contact 314a, which is shown as having substantial common area with gate structure 310, may not require retargeting of gate structure 310 in order to provide adequate electrical contact. Thus, it may be that only contacts 314b, which lack sufficient common area with gate structure 310 so as not to provide adequate electrical contact, are considered relevant to the proximity correction process. In this embodiment, the contact data set is manipulated by a sorting process which determines which contacts lack sufficient common area. Only those contacts that lack sufficient common area are included in the mask database. For example, in some embodiments, the contacts 314b may be considered as lacking sufficient common area if the contacts overhang from the associated gate structure 310 by a distance "X", which can be chosen to be any suitable distance. Non-limiting overhang values for X can range from 5 nm or more, such as from 10 nm or from 20 nm or more; while contacts that have an overhang value for X of less than the chosen amount can be considered to have sufficient common area. In another embodiment, the contacts 314b may be considered as lacking sufficient common area if less than, for example, 80% of the area of the contact pattern does not overlap the gate pattern, such as less than 70% or 50%; while contacts having an overlap area equal to or greater than the chosen value can be considered to have sufficient common area.

The dimensions disclosed for X and the contact area percentages, as well as any other pattern dimensions disclosed herein unless otherwise expressly stated, are based upon the size of the pattern to be formed on the wafer. The actual dimensions for X for the photomask patterns will vary depending upon the size of the reduction factor of the photomask. As discussed above, photomasks are often formed to have, for example, a 4× or 5× reduction factor, meaning that the photomask pattern dimensions can be about 4 or 5 times larger than the corresponding dimensions formed on the wafer. Similarly, the dimensions of the drawn pattern may or may not also have a reduction factor. Therefore, as one of ordinary skill in the art would readily understand, the mask sizes and the drawn pattern sizes can correspond to the wafer dimensions based on any suitable reduction factor, including where the dimensions on the mask and/or drawn pattern dimensions are intended to be the same as those formed on the wafer.

In yet another embodiment, it may be that some contacts are relevant for some proximity calculations and other contacts are relevant for different proximity calculations, or that the contacts can be considered to have varying degrees of relevance based on the degree to which they overhang. For example, a contact that has a 15 nm overhang may be considered less relevant than a contact that has a 25 nm overhang. In such cases, it could be possible to sort the contacts into subsets according to their relevance. The manipulated data resulting from the sorting can then be supplied to the proximity correction computer by any suitable technique.

In some embodiments, the contact data can be sorted into one or more data subsets and associated with markers for communicating desired information to the proximity correction software. For example, the contacts data can be sorted into a first data subset of contacts that are considered to be sufficiently covered (i.e., have sufficient common area with the gates) and a second data subset that are not considered sufficiently covered. Each subset can be associated with markers that are capable of communicating to the proximity correction process software any desired information regarding the individual data subsets, including, for example, that the first data subset is well covered and the second data subset is insufficiently covered. Associating data with markers is generally well known and readily within the capability of one of ordinary skill in the art. In this embodiment, some or all of the second set of data can be included in the mask pattern database, along with the markers. As discussed above, providing such markers can help improve the efficiency of the proximity correction process.

A modern integrated circuit can include well over a billion contacts. Thus, efficiently sorting the contact data and either excluding at least some irrelevant contact data from the mask pattern database, or marking the contact data as described above, can significantly reduce the amount of computer processing time and cost associated with the proximity correction process. In addition, decreasing the amount of data or marking the data in this manner may reduce the risk of errors in the proximity correction process that can potentially be caused by the proximity correction software mistakenly considering a non-relevant contact as being relevant.

Figure 4:
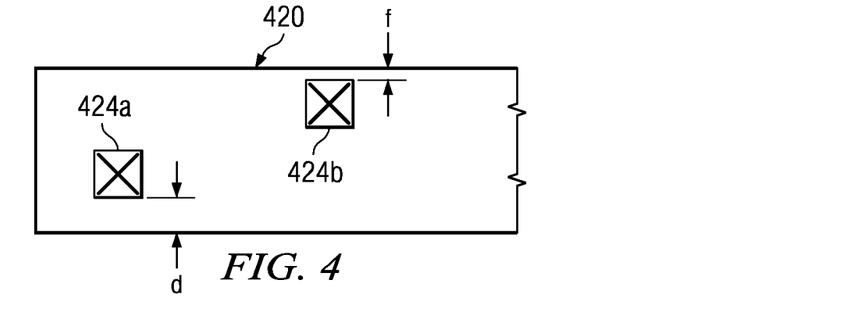
FIG. 4 illustrates a metal wiring pattern that is to be formed so as to contact adjacent biasing layers, according to an embodiment of the present disclosure.

The processes of the present application are not limited to mask data for correcting gate structure patterns, as in the above examples of FIG. 3, but could also be employed for forming other mask pattern features. For example, FIG. 4 illustrates a metal wiring pattern 420 that is to be formed so as to contact adjacent biasing layers. The biasing layers may include contacts that physically contact the metal wiring pattern. The data regarding the contacts adjacent to metal wiring pattern 420 can be manipulated based on the relevance to the proximity correction process, similarly as described above. For example, contacts 424a, which are substantially centered (e.g., have a distance "d", or greater, to the edge of metal pattern 420), can be considered not relevant to the proximity correction process; and contacts 424b, which are sufficiently off-center (e.g., have a smaller distance "f", or less, to the edge of 420) so as to make retargeting of the metal wiring pattern 420 desirable, can be considered relevant to the proximity correction process. Distances "d" and "f" may be chosen to be any desirable distance based on success in the lithographic process and may vary from location to location depending on other geometries in the regions surrounding 424a and 424b. Nonlimiting values of "f" can range from about 0 nm to about 50 nm, such as about 5 nm, about 10 nm or about 20 nm, where "d" can be, for example, any value greater than the chosen "f". Values outside of this non-limiting range can also be used, as is the case with all exemplary ranges provided herein.

In some embodiments of FIG. 4, relevant data can be included in the mask pattern database, and the irrelevant data excluded, similarly as described above. In other embodiments, markers can be employed to provide information regarding the relevance of the data to the proximity correction software, also as described above.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the", include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for preparing a mask pattern database for proximity correction, the method comprising:

receiving data from a design database;

generating mask pattern data describing a first photomask pattern for forming first device features, wherein the first photomask pattern is to be corrected for proximity effects in a proximity correction process and the first device features are gate structures;

accessing a second set of data comprising information about second device features, wherein at least a portion of the second set of data is relevant to the proximity correction process and the second device features are biasing layers formed adjacent to the gate structures;

manipulating the second set of data so as to improve the proximity correction process, as compared with the same proximity correction process in which the second set of data was included in the mask pattern database without being manipulated; and including at least a portion of the mask pattern data and at least a portion of the manipulated second set of data in the mask pattern database.

2. The method of claim 1, wherein the information about the second device features comprises locations of first contacts that are positioned on the gate structures and second contacts that are not positioned on the gate structures.

3. The method of claim 2, wherein manipulating the second set of data comprises sorting the data into a first data subset having a first relevance to the proximity correction process, and a second data subset having a second relevance to the proximity correction process.

4. The method of claim 3, wherein the first data subset comprises the locations of the first contacts, and the second data subset comprises the locations of the second contacts, and manipulating the second set of data comprises excluding the second data subset from the mask pattern database.

5. The method of claim 4, wherein the first data subset is included in the mask pattern database.

6. The method of claim 3, wherein the first contacts include both third contacts that do not share a desired common area with the gate structure, so as to make retargeting of the gate structure desirable, and fourth contacts that do share a desired common area with the gate structure; and wherein the first data subset comprises locations of the third contacts and the second data subset comprises locations of the second and fourth contacts, the first data subset being included in the mask pattern database and the second data subset being excluded from the mask pattern database.

7. The method of claim 3, wherein manipulating the second set of data further comprises associating the first data subset and the second data subset with markers that are capable of communicating the relevance of the first data subset and the second data subset to the proximity correction process.

8. The method of claim 2, wherein the first contacts and second contacts are designed to be formed without contact pads.

9. The method of claim 1, wherein improving the proximity correction process includes reducing the processing time of the proximity correction process as compared with the same proximity correction process in which the second set of data was included in the mask pattern database without being manipulated.

10. A method for preparing a mask pattern database for proximity correction, the method comprising:

receiving data from a design database;

generating mask pattern data describing a first photomask pattern for forming first device features, wherein the first photomask pattern is to be corrected for proximity effects in a proximity correction process;

accessing a second set of data comprising information about second device features, wherein at least a portion of the second set of data is relevant to the proximity correction process;

manipulating the second set of data so as to improve the proximity correction process, as compared with the same proximity correction process in which the second set of data was included in the mask pattern database without being manipulated; and including at least a portion of the mask pattern data and at least a portion of the manipulated second set of data in the mask pattern database;

wherein the first device feature is a metal pattern;

wherein the information about the second device feature comprises locations of first contacts that are sufficiently off-center on the metal pattern so as to make retargeting of the metal pattern desirable, and second contacts that are substantially centered on the metal pattern;

wherein manipulating the second set of data comprises sorting the data into a first data subset having a first relevance to the proximity correction process, and a second data subset having a second relevance to the proximity correction process;

wherein the first data subset includes the locations of the first contacts and the second data subset includes the locations of the second contacts; and wherein the first data subset is included in the mask pattern database and the second data subset is excluded from the mask pattern database.

11. The method of claim 10, wherein the first contacts are vias.

12. A computer system for generating photomask patterns, the system comprising one or more computers comprising a set of computer readable instructions for carrying out steps in a method for preparing a mask pattern database for proximity correction comprising:

receiving data from a design database;

generating mask pattern data describing a first photomask pattern for forming first device features, wherein the first photomask pattern is to be corrected for proximity effects in a proximity correction process and the first device features are gate structures;

accessing a second set of data comprising information about second device features, wherein at least a portion of the second set of data is relevant to the proximity correction process and the second device features are biasing layers formed adjacent to the gate structures;

manipulating the second set of data so as to improve the proximity correction process, as compared with the same proximity correction process in which the second set of data was included in the mask pattern database without being manipulated; and including at least a portion of the mask pattern data and at least a portion of the manipulated second set of data in the mask pattern database.

13. A computer readable storage medium comprising computer readable instructions embedded thereon for carrying out steps in a method for preparing a mask pattern database for proximity correction comprising:

receiving data from a design database;

generating mask pattern data describing a first photomask pattern for forming first device features, wherein the first photomask pattern is to be corrected for proximity effects in a proximity correction process and the first device features are gate structures;

accessing a second set of data comprising information about second device features, wherein at least a portion of the second set of data is relevant to the proximity correction process and the second device features are biasing layers formed adjacent to the gate structures;

manipulating the second set of data so as to improve the proximity correction process, as compared with the same proximity correction process in which the second set of data was included in the mask pattern database without being manipulated; and including at least a portion of the mask pattern data and at least a portion of the manipulated second set of data in the mask pattern database.

* * * * *